(12) United States Patent
Dang et al.

(10) Patent No.: US 7,474,540 B1
(45) Date of Patent: Jan. 6, 2009

(54) SILICON CARRIER INCLUDING AN INTEGRATED HEATER FOR DIE REWORK AND WAFER PROBE

(75) Inventors: Bing Dang, Chappaqua, NY (US); Steven L. Wright, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/972,388

(22) Filed: Jan. 10, 2008

(51) Int. Cl.
*H05K 1/11* (2006.01)

(52) U.S. Cl. ........................ 361/803; 361/748; 174/250

(58) Field of Classification Search ................. 361/760, 361/763, 767, 771–780; 219/209, 201, 200, 219/543; 174/260, 261, 262, 263
See application file for complete search history.

(56) References Cited

U.S. PATENT DOCUMENTS

| | | | |
|---|---|---|---|
| 4,374,316 A | | 2/1983 | Inamori et al. |
| 4,582,975 A | * | 4/1986 | Daughton .................... 219/209 |
| 5,421,943 A | | 6/1995 | Tam et al. |
| 5,455,445 A | * | 10/1995 | Kurtz et al. .................. 257/419 |
| 5,742,021 A | | 4/1998 | Economikos et al. |
| 6,031,729 A | * | 2/2000 | Berkely et al. ............... 361/771 |
| 6,233,150 B1 | | 5/2001 | Lin et al. |
| 7,234,218 B2 | * | 6/2007 | Farooq et al. ............... 29/426.4 |
| 2002/0170901 A1 | * | 11/2002 | Lau .............................. 219/209 |
| 2006/0065431 A1 | * | 3/2006 | Trucco ......................... 174/250 |

* cited by examiner

*Primary Examiner*—Dean A. Reichard
*Assistant Examiner*—Yuriy Semenenko
(74) *Attorney, Agent, or Firm*—Cantor Colburn LLP; Paul Zucco

(57) ABSTRACT

A silicon carrier package includes a multi-layer member having at least a first layer and a second layer. A first electronic component includes a plurality of connector members that establish a first bond electrically interconnecting the first electronic component to the multi-layer member. A second electronic component includes a plurality of connector members that establish a second bond electrically interconnecting the second electronic component to the multi-layer member. At least one heating element is integrated into one of the first and second layers of the multi-layer member. The at least one heating element is selectively activated to loosen only one of the first and second bonds to facilitate removal of only one of the first and second electronic components from the multi-layer member. The other of the first and second bonds remains intact.

4 Claims, 3 Drawing Sheets

SILICON CARRIER INCLUDING AN INTEGRATED HEATER FOR DIE REWORK AND WAFER PROBE

STATEMENT OF GOVERNMENT INTEREST

This invention was made with Government support under Contract No. NBCH3039004, awarded by the US Defense Advanced Research Projects Agency (DARPA). The Government has certain rights in this invention.

BACKGROUND OF THE INVENTION

Field of the Invention

This invention relates to the art of electronics and, more particularly, to a silicon carrier having an integrated heater to facilitate removal, attachment and testing of electronic components.

DESCRIPTION OF BACKGROUND

At present, removal of a single defective electronic component or chip from a multi-chip silicon carrier or module (MCM) is a challenge. That is, providing enough heat to melt solder joints that hold the defective chip to the MCM creates multiple solder reflows that are added to a process thermal budget. That is, often times removing one chip will also melt adjacent solder joints and degrade connections for adjacent components. By degrading adjacent connections, an overall efficiency, reliability and service life of an associated electronic device is reduced. Other processes currently in use for chip removal, such as various chemical removal methods, are cumbersome. Similar difficulties occur when replacing defective chips with good chips.

Solder bump interconnections are used in flip-chip and other packaging technologies. The bump connections between an integrated circuit chip and substrate have been historically referred to as controlled-collapse chip connections (C4). There is a need to test all components of a package module as early as possible in the manufacturing process. Specifically, there is a need to test device die, substrate or interposer, as well as interconnections and interactions between these components. One way to perform extensive tests prior to final assembly is to temporarily attach the device die to a special test substrate, or "temporary chip attach" (TCA). Prior to final assembly and test, it is desirable to have only "known-good" components. However, it is often the case that in spite of tests done with TCA, one or more device die components fail fully functional tests performed after assembly of the chip module. These failed devices must be removed without affecting other device chips.

A common method used to remove defective chips from single or multi-chip modules is through the use of a spring-loaded assembly. The spring-loaded assembly is clamped to a periphery of the defective chip. The entire module is heated in an oven, and when module temperature reaches the melting point of the C4 solder interconnections, the defective chip is pulled from the module by the force of the spring-loaded assembly. However, as noted above, a major drawback of this method is that all chip interconnections in the module are melted thereby subjecting all chips to a reflow of solder. It is known in the art that the reliability of solder interconnections decreases with extended heat treatment. Specifically, it is known that electromigration lifetime of solder interconnects decreases with the number of reflows. For high-performance multi-chip modules fabricated by conventional means, it is possible that more than 6 reflows may be required to assemble a fully functional module. Another problem encountered during die rework concerns stresses created on the C4 bumps and adjacent regions during die attachment. Upon cool down, stress can lead to interconnection failure. Meanwhile, heating an entire module for reflow requires a long time and a large amount of heat, and is therefore time consuming and inefficient.

Methods to establish a "known-good" device die involve an electrical probe and test of wafers having C4 bumps. With advancements in semiconductor technology and system complexity, an increased number of input and output connections are required. As spacing between C4 bumps is reduced, and C4 bumps size is decreased, probe and test become problematic. A major challenge establishing a simultaneous electrical connection to the entire bump array. As bump height is non-uniform, compliance in the probe tips is necessary. Typically, compliance is achieved by providing a biasing or spring action behind each probe tip. A force required to establish good electrical connection is on the order of 10 grams per probe tip. Therefore, if contact is required to a die with 10,000 bump interconnections, a total force required on a probe head would be 100 kilograms (220 lbs). At this level, test system cost and complexity becomes quite large in order to provide both a large probe head force and alignment accuracy.

SUMMARY OF THE INVENTION

The shortcomings of the prior art are overcome and additional advantages are provided through the provision of a silicon carrier package constructed in accordance with an exemplary embodiment of the present invention. The silicon carrier package includes a multi-layer member having at least a first layer and a second layer. A first electronic component includes a plurality of connector members that establish a first bond electrically interconnecting the first electronic component to the multi-layer member. A second electronic component includes a plurality of connector members that establish a second bond electrically interconnecting the second electronic component to the multi-layer member. At least one heating element is integrated into one of the first and second layers of the multi-layer member. The at least one heating element is selectively activated to loosen only one of the first and second bonds to facilitate removal of only one of the first and second electronic components from the multi-layer member. The other of the first and second bonds remains intact.

Additional features and advantages are realized through the techniques of exemplary embodiments of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the exemplary embodiments of the invention, together with advantages and features, by way of example with reference to the drawings.

DETAILED DESCRIPTION OF THE INVENTION

Figure 1:
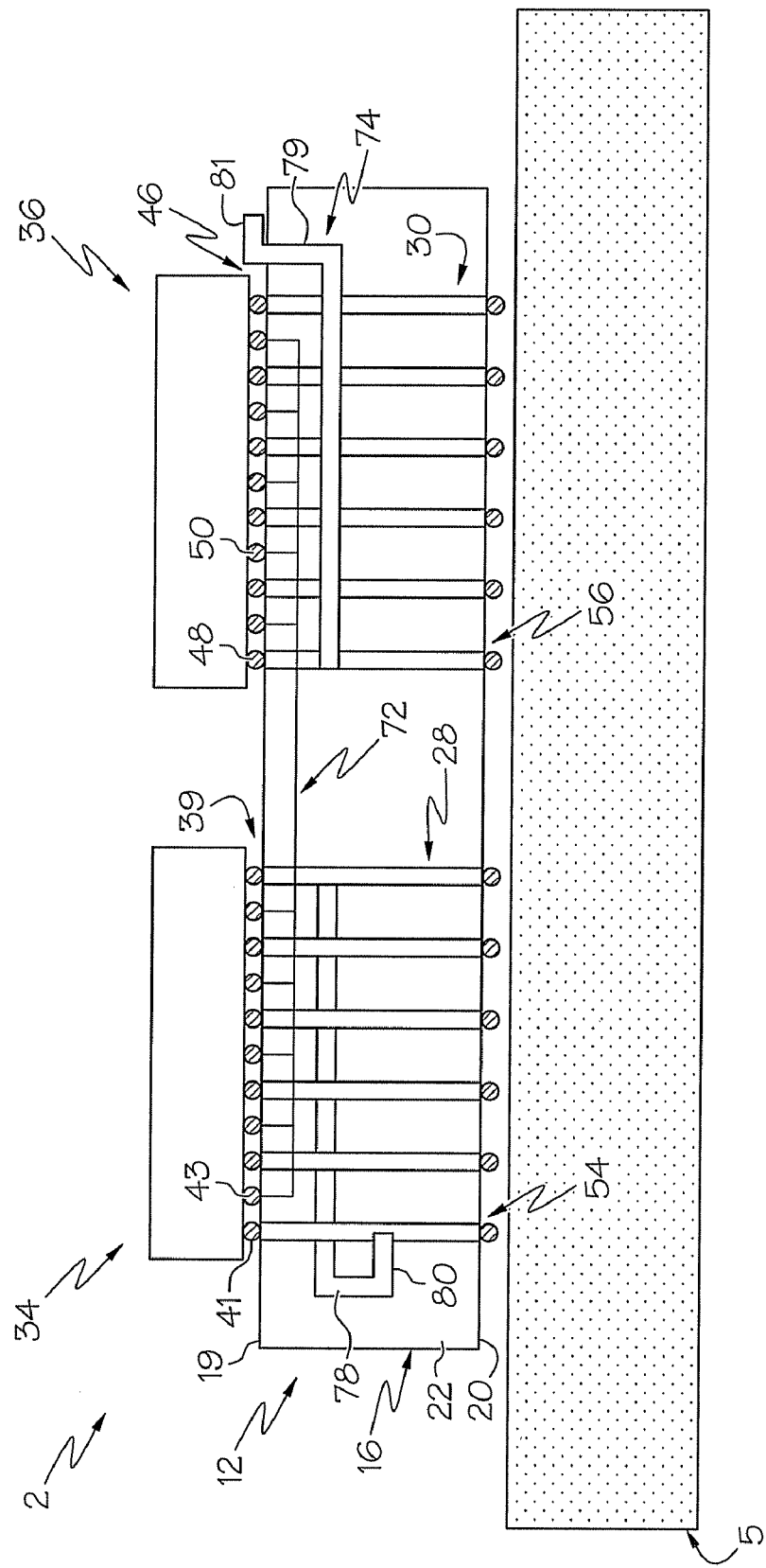
FIG. 1 is a schematic cross-sectional side view of a silicon carrier package employed in chip rework applications constructed in accordance with an exemplary embodiment of the present invention.

With initial reference to FIG. 1, a silicon carrier or interposer package in the form of a multi-chip module (MCM) is indicated generally at 2. Multi-chip module 2 is mounted to a substrate 5 and includes a silicon interposer member 12. Interposer member 12 includes a main body portion 16 having a first surface 19, a second surface 20, and an intermediate portion 22. Interposer member 12 includes a first plurality of vias, indicated generally at 28 that extend between first and second surfaces 19 and 20. Interposer member 12 is also shown to include a second plurality of vias, indicated generally at 30, that extend between first and second surfaces 19 and 20 and which are laterally offset from the first plurality of vias 28.

A first electronic component 34, shown in the form of a silicon device die, is mounted to first surface 19 at the first plurality of vias 28. Likewise, a second electronic component 36, also illustrated as a silicon device die, is mounted to first surface 19 at the second plurality of vias 30. First electronic component 34 includes a first ball grid array 39 that establishes a first bond or electrical interface to interposer 12. First ball grid array 39 includes a first plurality of connector members or controlled-collapse chip connections (C4 bumps), one of which is indicated at 41, and a second plurality of connector members or C4 bumps, one of which is indicated at 43. Similarly, second electronic component 36 includes a second ball grid array 46 that establishes a second bond or electrical interface to interposer 12. Second ball grid array 46 includes a first plurality of connector members or C4 bumps, one of which is indicated at 48, and a second plurality of connector members or C4 bumps, one of which is indicated at 50.

In the embodiment shown, the first plurality of connector members 41 on first electronic component 34 register with the first plurality of vias 28 and connect to substrate 5 through a corresponding plurality of connector members 54 provided on second surface 20. In a similar manner, the first plurality of connector members 48 on second electronic component 36 register with the second plurality of vias 30 and connect to substrate 5 through a corresponding plurality of connector members 56 provided on second surface 20. In further accordance with the embodiment shown, the second plurality of connector members 43 on first electronic component 34 interconnect with the second plurality of connector members 50 on second electronic component 36. Towards that end, interposer 12 includes a first layer or wiring level 72 that serves as an electrical interface between first and second electronic components 34 and 36.

In order to facilitate the selective removal of one of first and second electronic components 34 and 36 without affecting the connection between interposer 12 and the other of the first and second electronic components 34 and 36, interposer 12 includes a second or heater layer 74 within which is arranged a first heating element 78 and a second heating element 79. Thus, interposer 12 is a multi-layer silicon member defined by first layer or wiring level 72 and second layer or heating level 74. First heating element 78 is integrated into interposer 12 proximate to first electronic component 34. First heating element 78 includes an end portion 80 that is electrically connected to one of the plurality of connector members 54 through one of the plurality of vias 28. First heating element 78 is selectively activated to loosen the bond between the first and second plurality of connector members 41 and 43 and interposer 12. In this manner, first electronic component 34 can be removed from interposer package 2 without affecting the bond between second electronic component 36 and interposer 12. Of course, heating element 78 can also be activated to facilitate attachment of first electronic component 34.

Second heating element 79 is integrated into interposer 12 proximate to second electronic component 36. Second heating element 79 includes an end portion 81 that extends along first surface 19 of interposer 16. With this arrangement, second heating element 79 is provided with an external or surface connection (not shown). In a manner similar to that described above, second heating element 79 is selectively activated to loosen the bond between the first and second plurality of connector members 48 and 50 and interposer 12. In this manner, second electronic component 36 can be removed from interposer package 2 without affecting the bond between first electronic component 34 and interposer 12. Of course it should be understood that while first heating element 78 is configured with an internal connection and second heating element 79 is configured with an external connection, both first and second heating element 78 and 79 can be configured with either internal and/or external connections. Moreover, heating element 79 can also be activated to facilitate attachment of second electronic component 36.

Figure 2:
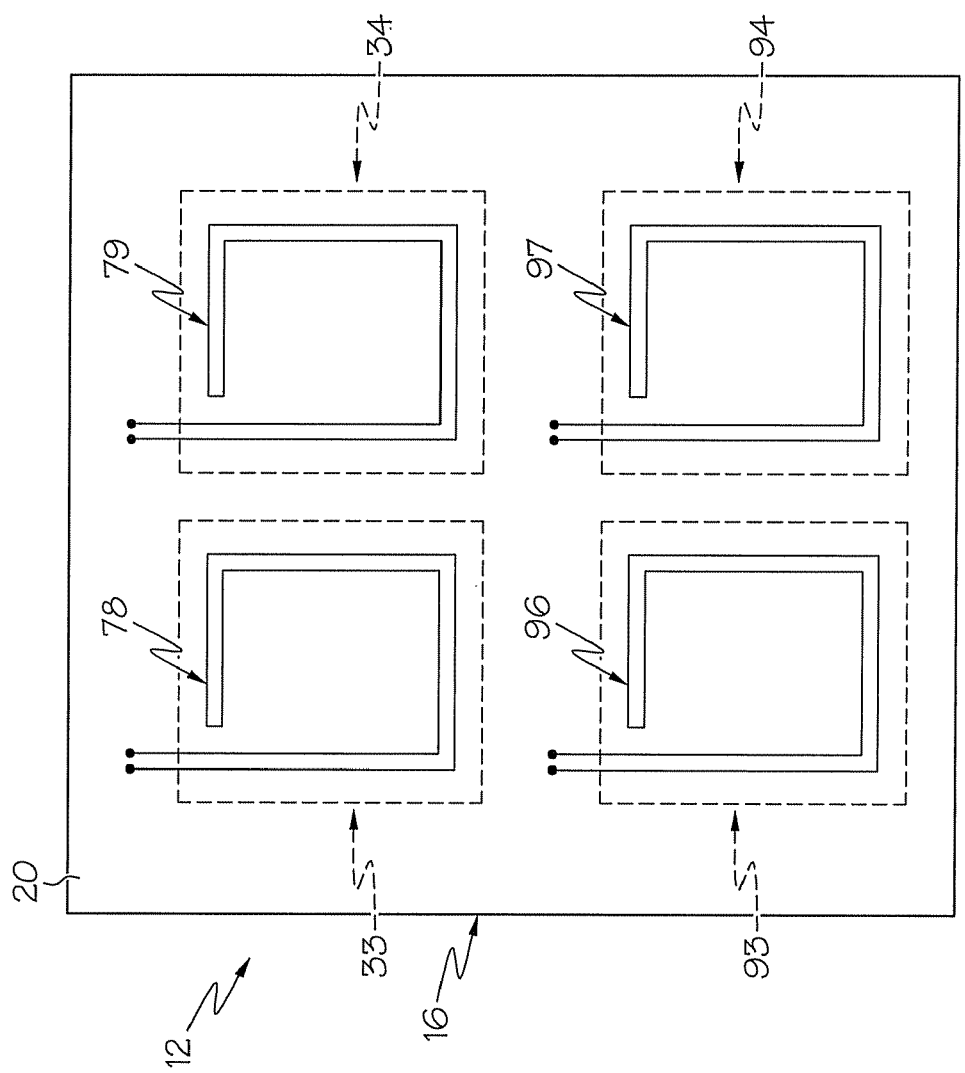
FIG. 2 is a schematic bottom plan view of the silicon carrier package of FIG. 1.

At this point it should be appreciated that exemplary embodiments of the invention while shown and described in connection with two electronic components mounted to interposer 12, could include additional electronic components, such as shown at 93 and 94 in FIG. 2. Each additional electronic component 93 and 94 is provided with a corresponding heating element 96 and 97. In this manner, exemplary embodiments of the present invention provide a system that allows the selective removal/detachment and/or attachment of one or more electronic components from a multi-component package without affecting others of the electronic components. Also it should be appreciated that in addition multi-component modules, the present invention can also be employed in a temporary chip attach or (TCA).

Figure 3:
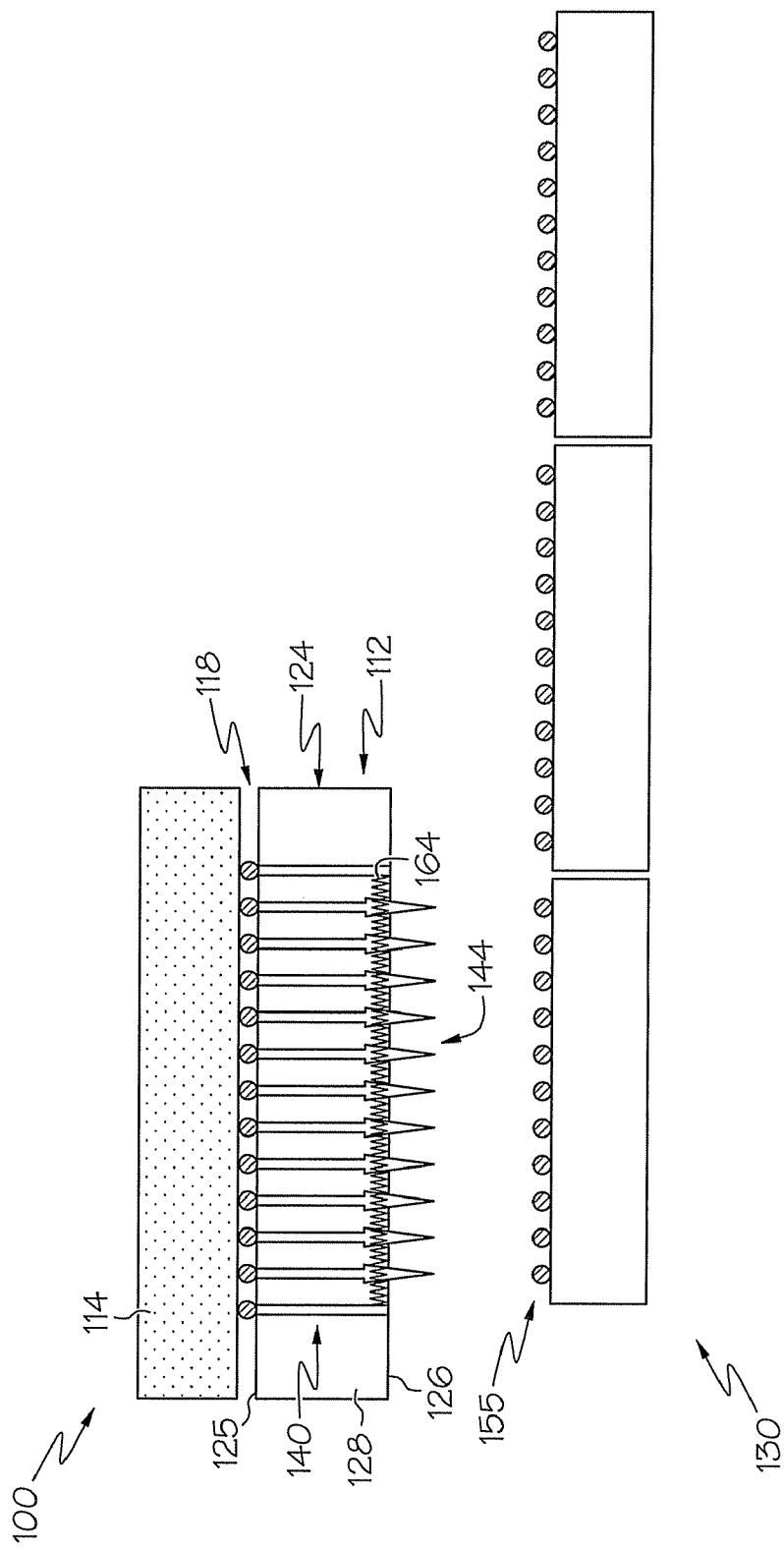
FIG. 3 is a schematic cross-sectional side view of a silicon carrier package employed in wafer probe and electrical test applications constructed in accordance with another exemplary embodiment of the present invention.

Reference will now be made to FIG. 3 in describing a probe head 100 provided with a silicon interposer 112 constructed in accordance with another exemplary embodiment of the present invention. As shown, probe head 100 includes a substrate 114 provides with a plurality of C4 bumps 118. C4 bumps 118 electrically connect probe head 100 to interposer 112. More specifically, interposer 112 includes a main body 124 having a first surface 125 that extends to a second surface 126 though an intermediate portion 128. A plurality of vias, one of which is indicated at 140, extend between first surface 125 and second surface 126. Vias 140 provides an electrical interface between probe head 100 and an electrical device to be tested indicated generally at 130. Towards that end, the plurality of vias 140 terminates in a corresponding plurality of probe tips 144. Probe tips 144 are configured in a pattern for wafer probing. That is, each of the plurality of probe tips 144 is arranged so as to register with a corresponding one of a plurality of C4 bumps 155 provided on device 130. An electrical connection is established between probe head 100 and device 130 by soldering each probe tip 144 to a corresponding C4 bump 155. In order to facilitate soldering and, more specifically, attachment and removal of probe head 100 to device 130, interposer 112 is provided with an integrated heating element 164. Heating element 164 is selectively activated to heat probe tips 144 and create a reflow of solder that establishes an electrical bond between probe head 100 and device 130. More specifically, heating element 164 is selectively activated to heat probe tips 144 locally melt the C4 solder bumps. In this manner, probe tips 144 protrude into the C4 bumps with very small force. Heating element 164 is also selectively activated to heat probe tips 144 to detach or disconnect probe head 100 from device 130. In any case it should be understood that heating element 164 can be activated continuously or in short pulses to ensure minimal heating of surrounding regions.

At this point it should be understood that as the silicon carrier package and the device die are each formed from similar material, i.e., silicon, there is no difference in thermal expansion between these components. For this reason, replacement of a defective die with a good die can be done with minimal stress on the C4 interconnections and adjacent regions. That is, in contrast to glass ceramic and/or organic carriers in which thermal expansion and warpage created during heating limits the type, location and use of integrated heating elements, the use of matched components, e.g., matching thermal expansion rates between components by forming both the carrier package and device die from silicon, allows for more sophisticated heater designs. In addition, it should be understood that the heating elements may be configured to provide a non-uniform heat to the electric elements to further refine removal, attachment and/or testing.

While preferred embodiments of the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A silicon carrier interposer comprising:
   a multi-layer silicon member, the multi-layer silicon member including a main body portion having a first surface, a second surface and an intermediate portion;
   a first electronic component mounted to the first surface of the multi-layer silicon member, the first electronic component including a plurality of connector members that establish a first bond electrically interconnecting the first electronic component to the silicon interposer;
   a second electronic component mounted to the first surface of the multi-layer silicon member, the second electronic component including a plurality of connector members that establish a second bond electrically interconnecting the second electronic component to the silicon interposer;
   a plurality of vias provided in the main body portion, the plurality of vias extending between the first surface and the second surface, the plurality of vias being adapted to provide an interface between the first and second electronic components and a substrate;
   a plurality of connector members arranged on the second surface of the multi-layer silicon member, each of the plurality of connector members being positioned at a corresponding one of the plurality of vias; and
   a plurality of heating elements integrated into the main body portion of the multi-layer silicon member, the plurality of heating elements being selectively activated to create a reflow of solder to facilitate one of an attachment of one of the first and second electronic components to the multi-layer silicon member and a detachment of the one of the first and second electronic components from the multi-layer silicon member.

2. The silicon interposer package according to claim 1, wherein the plurality of heating elements include a first heating element positioned proximate to the first electronic component and a second heating element being positioned proximate to the second electronic component, the first heating element being selectively activated to loosen the first bond and the second heating element being selectively activated to loosen the second bond.

3. The silicon interposer package according to claim 1, wherein the silicon interposer package is a multi chip module (MCM).

4. The silicon interposer according to claim 1, further comprising: a plurality of probe tips fixedly mounted to the second surface of the multi-layer silicon member at each of the plurality of vias, the plurality of heating elements being selectively activated to heat the plurality of probe tips to create a reflow of solder to selectively establish an electrical bond between the silicon interposer and an electrical device to be tested with the plurality of probe tips being arranged in a pattern designed for wafer probing.

* * * * *